US012676290B2

(12) United States Patent
Kim

(10) Patent No.: US 12,676,290 B2
(45) Date of Patent: Jul. 7, 2026

(54) PLASMA GENERATOR AND METHOD OF USING SAME

(71) Applicant: JEHARA CORPORATION, Suwon-si (KR)

(72) Inventor: Hongseub Kim, Hwaseong-si (KR)

(73) Assignee: JEHARA CORPORATION, Suwon-si (KR)

( * ) Notice: Subject to any disclaimer, the term of this patent is extended or adjusted under 35 U.S.C. 154(b) by 88 days.

(21) Appl. No.: 18/770,268

(22) Filed: Jul. 11, 2024

(65) Prior Publication Data

US 2025/0079123 A1     Mar. 6, 2025

(30) Foreign Application Priority Data

Sep. 4, 2023   (KR) ........................ 10-2023-0117116

(51) Int. Cl.
*H01J 37/32*          (2006.01)

(52) U.S. Cl.
CPC .. *H01J 37/32146* (2013.01); *H01J 37/32183* (2013.01); *H01J 37/32449* (2013.01); *H01J 2237/334* (2013.01)

(58) Field of Classification Search
None
See application file for complete search history.

(56) References Cited

U.S. PATENT DOCUMENTS 6,849,857 B2 *  2/2005  Ichiki ................ H01J 37/32357
                                                       118/723 MR
10,115,569 B2    10/2018  Kim

| 10,774,423 | B2 * | 9/2020 | Janakiraman | ....... C23C 16/5096 |
| 2003/0029567 | A1 * | 2/2003 | Dhindsa | ............ H01J 37/32522 |
| | | | | 315/111.21 |
| 2005/0020070 | A1 * | 1/2005 | Ichiki | .................. H01L 21/3065 |
| | | | | 438/689 |
| 2009/0236214 | A1 * | 9/2009 | Janakiraman | ..... H01J 37/32532 |
| | | | | 118/723 R |
| 2011/0079581 | A1 * | 4/2011 | Jeon | ...................... H01J 37/321 |
| | | | | 216/67 |
| 2011/0133650 | A1 * | 6/2011 | Kim | ...................... H01J 37/321 |
| | | | | 315/111.21 |

(Continued)

FOREIGN PATENT DOCUMENTS

| KR | 10-2010-0117205 A | 11/2010 |
| KR | 10-1813497 B1 | 1/2018 |
| KR | 10-2023-0118568 A | 8/2023 |

*Primary Examiner* — Srinivas Sathiraju
(74) *Attorney, Agent, or Firm* — You & IP, LLC

(57)          ABSTRACT

A plasma generator and a method of using the same are proposed. The disclosed relates to a plasma generator and a method of using the same capable of improving the uniformity of plasma used in a semiconductor manufacturing process and forming fine patterns and patterns having a high aspect ratio by precisely controlling ion energy. The plasma generator includes a vacuum chamber, a source electrode provided in the vacuum chamber, a bias electrode provided to correspond to the source electrode in the vacuum chamber and on which a substrate seated thereon, a shower head unit provided on a lower part of the source electrode to supply reaction gas to a plasma space above the substrate, an RF power supply unit for applying RF power to the source electrode, and a bias power supply unit connected to the bias electrode to apply bias power.

10 Claims, 12 Drawing Sheets

(56)  References Cited

U.S. PATENT DOCUMENTS

| | | | |
|---|---|---|---|
| 2012/0031561 A1* | 2/2012 | Kim | H01J 37/32091 |
| | | | 156/345.48 |
| 2012/0231631 A1* | 9/2012 | Kim | H01J 37/32082 |
| | | | 156/345.48 |
| 2016/0145742 A1* | 5/2016 | Janakiraman | C23C 16/503 |
| | | | 118/728 |
| 2017/0200590 A1* | 7/2017 | Rodrigo | H01J 37/32862 |
| 2017/0365447 A1* | 12/2017 | Kim | C23C 16/45544 |
| 2017/0372875 A1* | 12/2017 | Kim | H01J 37/32577 |
| 2018/0073142 A9* | 3/2018 | Janakiraman | C23C 16/4412 |
| 2018/0114676 A1* | 4/2018 | Kim | H01J 37/32834 |
| 2020/0058469 A1* | 2/2020 | Ranjan | H01J 37/32146 |
| 2021/0066040 A1* | 3/2021 | Kubota | H01J 37/32532 |
| 2021/0296131 A1* | 9/2021 | Ramaswamy | H01L 21/31116 |
| 2022/0310357 A1* | 9/2022 | Ventzek | H01J 37/32174 |
| 2023/0215707 A1* | 7/2023 | Niizeki | H01J 37/3244 |
| | | | 156/345.27 |
| 2023/0317430 A1* | 10/2023 | Morioka | H01J 37/32174 |
| | | | 156/345.51 |
| 2023/0326718 A1 | 10/2023 | Sasaki et al. | |
| 2023/0402263 A1* | 12/2023 | Matsumoto | H01J 37/32568 |
| 2024/0055229 A1* | 2/2024 | Zhang | H01J 37/32128 |
| 2024/0258078 A1* | 8/2024 | Sato | H01L 21/6833 |
| 2025/0079123 A1* | 3/2025 | Kim | H01J 37/32146 |

* cited by examiner

210

220

PLASMA GENERATOR AND METHOD OF USING SAME

CROSS REFERENCE TO RELATED APPLICATION

The present application claims priority to Korean Patent Application No. 10-2023-0117116, filed Sep. 4, 2023, the entire contents of which are incorporated herein for all purposes by this reference.

BACKGROUND OF THE INVENTION

Field of the Invention

The present disclosure relates to a plasma generator and a method of using the same capable of improving the uniformity of plasma used in a semiconductor manufacturing process and forming fine patterns and patterns having a high aspect ratio by precisely controlling ion energy.

Description of the Related Art

Plasma generators are used for deposition and etching in semiconductor manufacturing equipment, LCD devices, and solar light manufacturing equipment, and it is very important to improve the uniformity of etching and deposition. Recently, as the size of a substrate becomes larger, the size of an antenna for generating plasma also increases, thus increasing the uniformity of the plasma is important and more required. Since a plate antenna, which is a source electrode constituting a plasma generator, is in a state of floating, boundary conditions are not determined, and due to this, the uniformity of an electric field between the center and the edge of the source electrode is reduced, whereby RF power transmitted to an edge portion of the source electrode decreases. Such non-uniformity of an electromagnetic field causes a standing wave effect, so there is a problem in that the uniformity of plasma generated at the edge portion of the plate antenna is deteriorated. In order to solve such a problem, in Korean Patent No. 10-1813497 (publication date: Jan. 2, 2018), the present applicant has proposed a plasma generator capable of improving the uniformity of plasma and also easily controlling the distribution of the plasma.

FIGS. 1A and 1B are respectively a front configuration diagram and a plan configuration diagram of a plasma generator according to the related art.

Referring to FIG. 1, the plasma generator of the related art includes a plate electrode consisting of a source electrode unit 10 and a bias electrode unit 20, which are provided in a vacuum chamber, wherein the source electrode unit 10 is connected to an RF power supply unit 40 through an impedance matching unit 30 interposed therebetween, and the bias electrode unit 20 is connected to a bias RF power supply unit 50 through the bias impedance matching unit interposed therebetween.

The RF power supply unit 40 is connected thereto by a first power contact point p1 of the source electrode unit 10, and in this case, the first power contact point p1 is a geometric center of the source electrode unit 10 and is positioned at an electromagnetic impedance center.

The bias RF power supply unit 50 is connected by a second power contact point p2 of the bias electrode unit 20, and the second power contact point p2 is positioned on the bias electrode unit 20.

The source electrode unit 10 is a circular plate-shaped electrode, and along an edge thereof, has one common contact point cc connected to a plurality of contact points cp1 to cp8 by respective connection lines. This common contact point cc is connected to an impedance controller 60. The plurality of contact points cp1 to cp8 is arranged to be rotationally symmetrical relative to the geometric center of a source electrode unit 110. Such a plasma generator has an advantage of being able to increase the uniformity of plasma only by controlling the impedance controller 60.

The present disclosure intends to develop a plasma generator capable of improving the uniformity of plasma by continuously researching and improving the plasma generator for generating such plasma, so as to apply for the present disclosure.

DOCUMENTS OF RELATED ART

Korean Patent No. 10-1813497 (publication date: Jan. 2, 2018)

SUMMARY OF THE INVENTION

An objective of the present disclosure is to provide a plasma generator capable of improving the uniformity of plasma used in a semiconductor manufacturing process.

In addition, another objective of the present disclosure is to provide a plasma generator and a method of using the same for forming fine patterns and patterns having a high aspect ratio by precisely controlling ion energy.

According to one form of the present disclosure to achieve these objectives, there is provided a plasma generator including: a vacuum chamber; a source electrode provided in the vacuum chamber; a bias electrode provided to correspond to the source electrode in the vacuum chamber and on which a substrate is seated; a shower head unit provided on a lower part of the source electrode to supply reaction gas to a plasma space above the substrate; an RF power supply unit for applying RF power to the source electrode; and a bias power supply unit connected to the bias electrode to apply bias power, wherein the shower head unit is configured to control the reaction gas supplied to a center zone and an edge zone of the substrate.

Preferably, the shower head unit may include: a first shower head unit having a first gas supply section provided with a first gas to be introduced to the edge zone of the substrate, and a first gas inlet hole through which the first gas diffused in the first gas supply section flows; and a second shower head unit having a second gas supply section provided with a second gas to be introduced to the center zone of the substrate, and a second gas inlet hole through which the second gas diffused in the second gas supply section flows.

More preferably, the second shower head unit may further include: a third gas supply section provided with a partition for dividing an internal space into the center zone and the edge zone, and having a third gas inlet hole for flowing the first gas introduced through each first gas inlet hole and then diffused, wherein the second gas supply section flows the gas to the center zone of the substrate, and the third gas supply section flows the gas to the edge zone of the substrate.

More preferably, the source electrode may include: a first gas supply port for injecting the first gas; a second gas supply port for injecting the second gas; and a first baffle for diffusing the first gas injected through the first gas supply port to the first gas supply section.

More preferably, the first gas supply port may be a contact point to which the RF power is applied, and the first baffle may be provided at a center of the source electrode.

Preferably, the first shower head unit may further include a second baffle for diffusing the second gas supplied through the second gas supply port into the second gas supply section, and more preferably, the second baffle may be provided at a center of the first shower head unit.

Preferably, the bias power supply unit may be a direct current (DC) pulse generation module for generating a DC bias pulse, and more preferably, the DC pulse generation module may include: a pulse generator for generating an alternating current (AC) pulse; a first rectifier for performing half-wave rectification of the pulse generated by the pulse generator to generate a positive (+) DC pulse; and a second rectifier for performing half-wave rectification of the pulse generated by the pulse generator to generate a negative (−) DC pulse.

Preferably, the plasma generator may further include: a bias matcher for controlling an impedance connected in parallel to the DC pulse generation module; and an RF bias.

Next, according to the present disclosure, there is provided a method of etching a substrate by using the plasma generator described above, the method including: a first step S10 of injecting gas; a second step S20 of controlling pressure in a vacuum chamber; a third step S30 of applying RF power by operating an RF power supply unit; a fourth step S40 of applying a negative (−) DC pulse to a bias power supply unit by using a DC pulse generation module; and a fifth step S50 of applying a positive (+) DC pulse to the bias power supply unit by using the DC pulse generation module.

The plasma generator of the present disclosure has an effect that a shower head unit for supplying reaction gas to a plasma space above a substrate is provided to enable control of the amount of the reaction gas supplied to a center zone and an edge zone of the substrate, thereby improving the uniformity of plasma.

In addition, the plasma generator of the present disclosure has another effect that a bias power unit uses a direct current (DC) pulse generation module for generating a DC bias pulse, whereby fine patterns and patterns having a high aspect ratio may be formed by precisely controlling ion energy.

DETAILED DESCRIPTION OF THE INVENTION

Specific structures and functional descriptions presented in exemplary embodiments of the present disclosure are exemplified for the purpose of describing the exemplary embodiments according to a concept of the present disclosure only, and the exemplary embodiments according to the concept of the present disclosure may be implemented in various forms. In addition, it should not be construed as being limited to the exemplary embodiments described herein, and should be understood to include all modifications, equivalents, and substitutes included in the idea and scope of the embodiments of the present disclosure.

Meanwhile, in the embodiments of the present disclosure, it will be understood that, although the terms "first", "second", etc. may be used herein to describe various components, these components should not be limited by these terms. The terms are only used for the purpose of distinguishing one component from other components. For instance, within a scope not departing from the scope of rights according to the concept of the embodiments of the present disclosure, a first component may be referred to as a second component, and similarly, the second component may also be referred to as the first component.

It will be understood that when a component is referred to as being "coupled" or "connected" to another component, it may be directly coupled or connected to the other component or intervening components may be present therebetween. In contrast, when a component is described as being "directly connected", "directly coupled", or "directly linked" to another component, it should be understood that there are no intervening components present therebetween. Other expressions for explaining the relationship between components, such as "between", "directly between", "adjacent to", or "directly adjacent to" should be construed in the same way.

The terminology used in the present specification is for the purpose of merely describing particular exemplary embodiments, and is not intended to be limiting. As used herein, the singular forms are intended to include the plural forms as well, unless the context clearly indicates otherwise. In the present specification, it will be understood that the terms "comprise", "include", "have", etc., when used in this specification, specify the presence of stated features, numbers, steps, operations, elements, components, and/or combinations thereof, but do not exclude in advance the presence or addition of one or more other features, numbers, steps, operations, elements, components, and/or combinations thereof.

Hereinafter, specific exemplary embodiments of the present disclosure will be described with reference to the attached drawings.

5 6

Figure 1A:
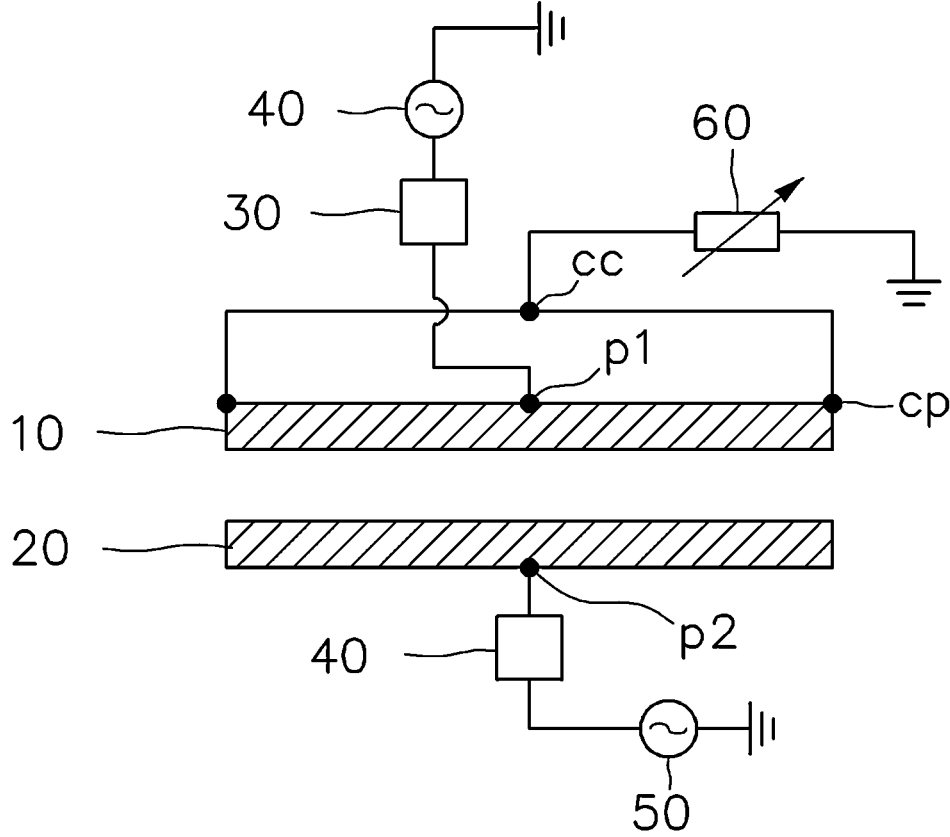
FIGS. 1A and 1B are respectively a front configuration diagram and a plan configuration diagram of a plasma generator according to the related art.
Figure 1B:
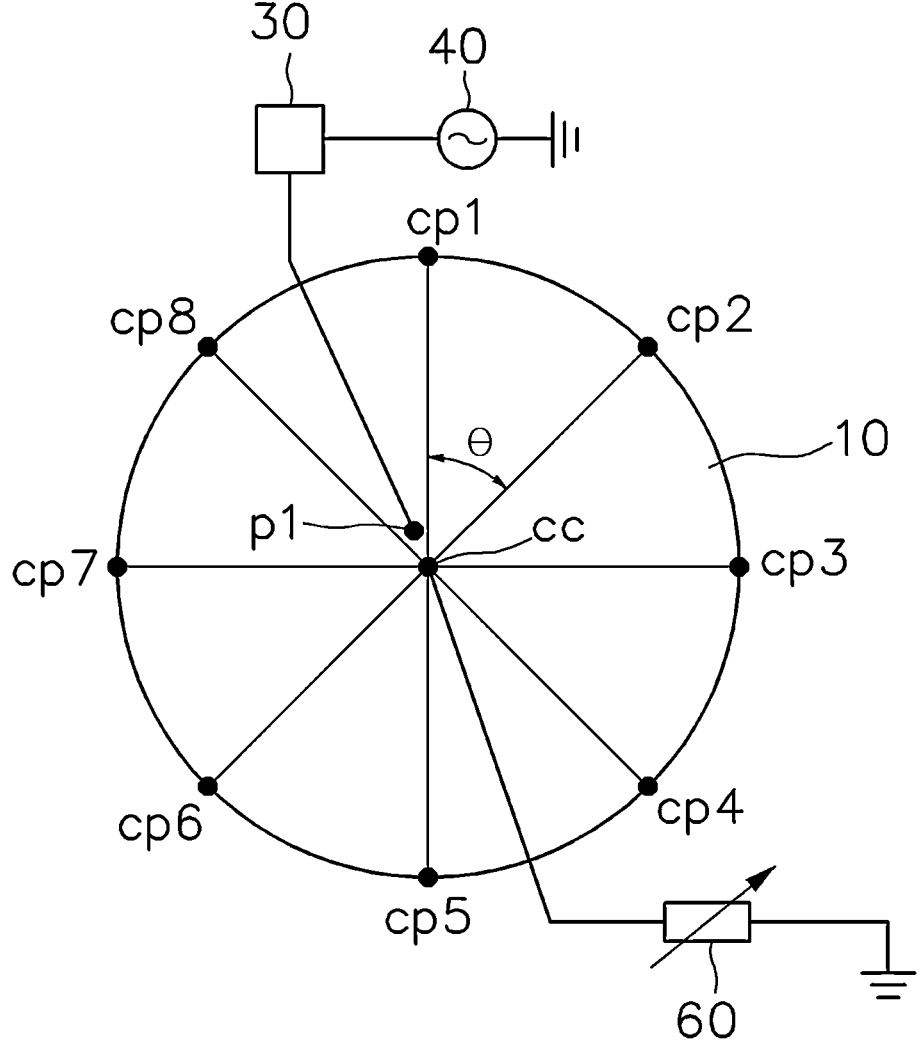
Figure 2:
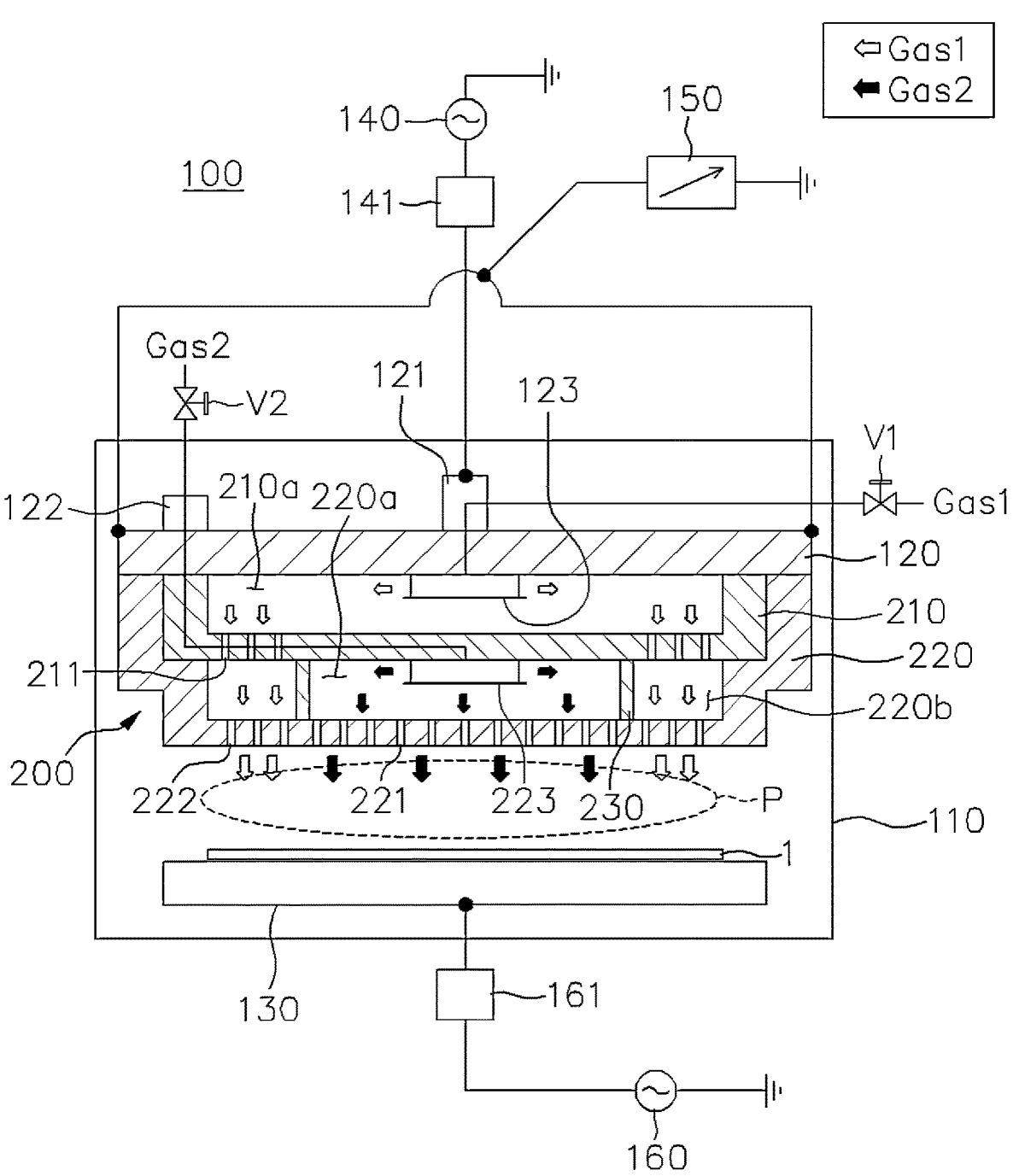
FIG. 2 is a configuration diagram illustrating a plasma generator according to an exemplary embodiment of the present disclosure.
Figure 3A:
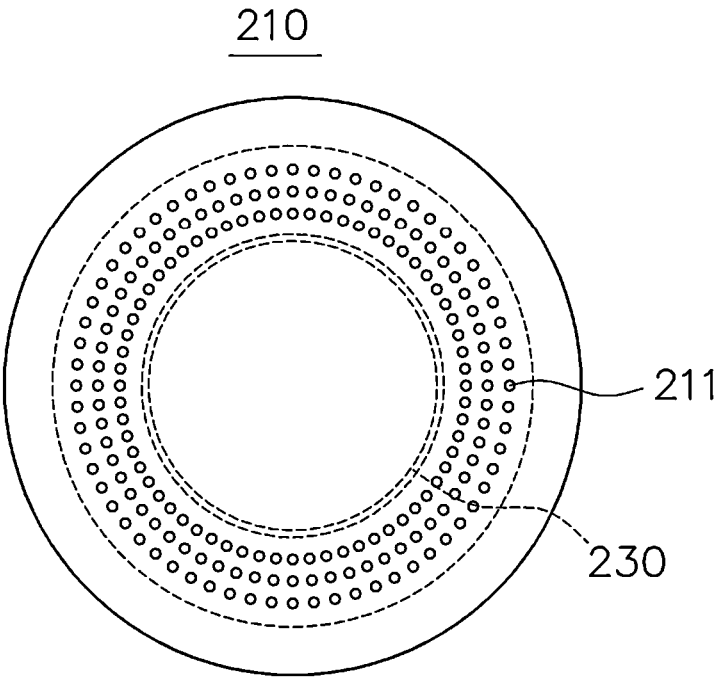
FIGS. 3A and 3B are respective plan configuration diagrams of a first shower head unit and a second shower head unit in the plasma generator according to the exemplary embodiment of the present disclosure.
Figure 3B:
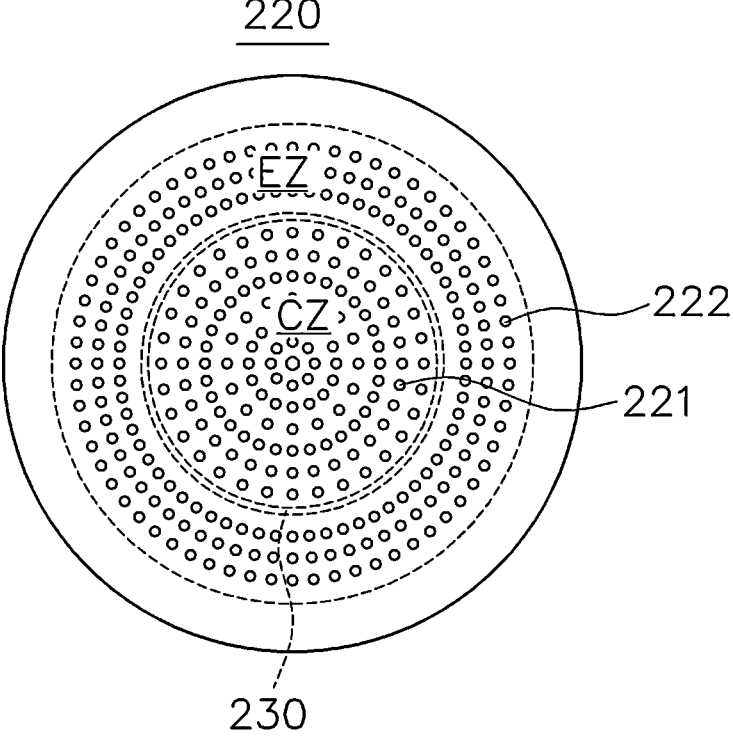
Figure 4:
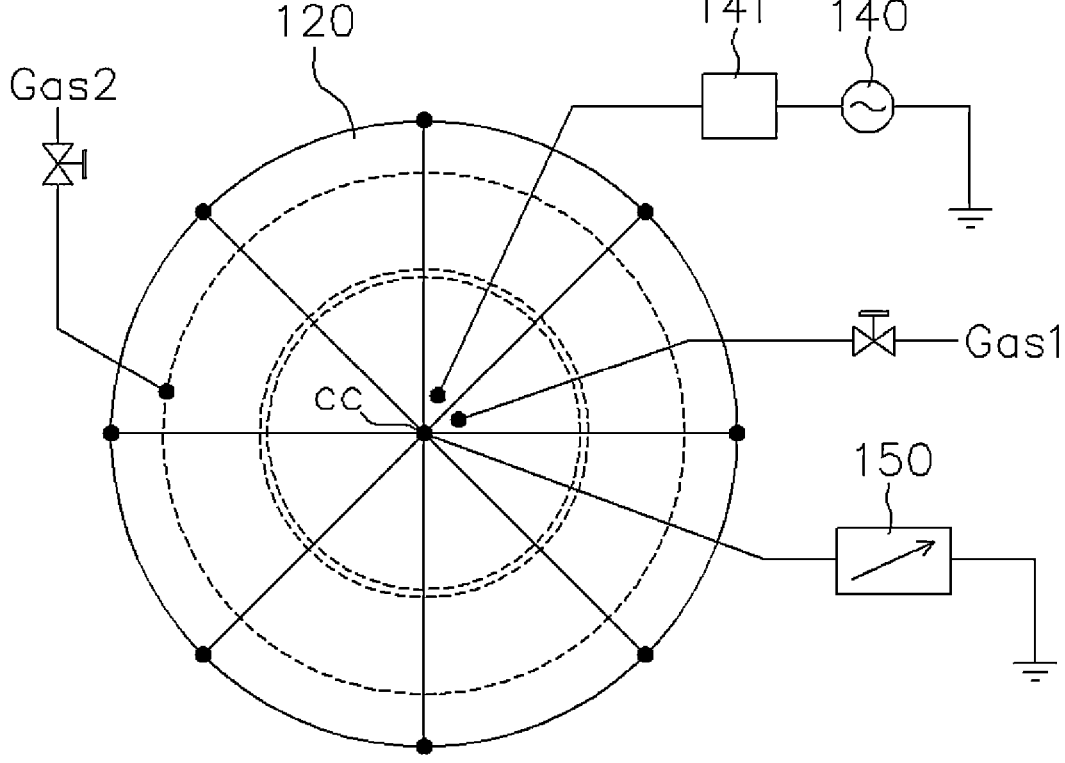
FIG. 4 is a plan configuration diagram of a source electrode in the plasma generator according to the exemplary embodiment of the present disclosure.

FIG. 2 is a configuration diagram illustrating a plasma generator according to an exemplary embodiment of the present disclosure. FIGS. 3A and 3B are respective plan configuration diagrams of a first shower head unit and a second shower head unit in the plasma generator according to the exemplary embodiment of the present disclosure. FIG. 4 is a plan configuration diagram of a source electrode in the plasma generator according to the exemplary embodiment of the present disclosure.

Referring to FIGS. 2 to 4, a plasma generator 100 of a present exemplary embodiment includes: a vacuum chamber 110; a source electrode 120 provided in the vacuum chamber; a bias electrode 130 corresponding to the source electrode 120, provided in the vacuum chamber 110, and provided with a substrate 1 seated thereon; and a shower head unit 200 provided below the source electrode to supply reaction gas to a plasma space P above the substrate.

The shower head unit 200 is characterized by controlling reaction gas supplied into a center zone and an edge zone of the substrate 1. Specifically, the shower head unit 200 includes a first shower head unit 210 into which a first gas is introduced and diffused; and a second shower head unit 220 into which a second gas is introduced and diffused.

The first shower head unit 210 is provided with the source electrode 120 as a cover on an upper part thereof so as to provide a first gas supply section 210*a* in which the first gas is introduced and diffused, and is formed with each first gas inlet hole 211 at a lower surface thereof for flowing the first gas.

The second shower head unit 220 is assembled to a lower part of the first shower head unit 210, is provided with a second gas supply section 220*a* in which the second gas is introduced and diffused, and is formed with each second gas inlet hole 221 at a lower surface thereof for flowing the second gas. Preferably, the second shower head unit 220 is provided with a third gas supply section 220*b* for communicating with each first gas inlet hole 211 to allow the first gas to be introduced and diffused, and is formed with each third gas inlet hole 222 at the lower surface thereof for flowing the first gas.

Specifically, the first shower head unit 210 is a cylindrical body with a predetermined depth so as to form the first gas supply section 210*a*, is configured to have a predetermined level difference, and is inserted and assembled to the inner side of the second shower head unit 220. The second shower head unit 220 is partitioned inside by a partition wall 230 and is provided with the second gas supply section 220*a* and the third gas supply section 220*b*.

The first shower head unit 210 is formed with a plurality of first gas inlet holes 211 for supplying the first gas to the edge zone of the substrate outside the partition wall 230.

The second shower head unit 220 is formed with a plurality of second gas inlet holes 221 for supplying the second gas to the center zone CZ of the substrate inside the partition wall 230, and is formed with a plurality of third gas inlet holes 222 for directly supplying the first gas to the edge zone EZ of the substrate outside the partition wall 230.

The source electrode 120 is provided as a cover on the upper part of the first shower head unit 210. In an upper part of the cover, a first gas supply port 121 through which a first gas is introduced and a second gas supply port 122 through which a second gas is introduced are provided. The gas supply ports 121 and 122 are respectively provided with supply control valves V1 and V2 for controlling the flow rates of first gas and second gas.

Preferably, the first gas supply port 121 is provided at the geometric center of the source electrode 120 and serves as a power contact point connected to the RF power unit 140. The RF power supply unit 140 may be connected to the first gas supply port 121 through an impedance matching unit 141 interposed therebetween.

The source electrode 120 is provided with a first baffle 123 on the lower part thereof for flowing the first gas to the first gas supply section 210*a*. The first shower head unit 210 is also provided with a second baffle 223 on a lower part thereof for flowing the second gas to a second gas supply section 220*b*. The source electrode 120 and the first shower head unit 210 may respectively connect the gas supply ports 121 and 122 to the baffles 123 and 223 to form internal flow paths for gas flow. The first baffle 123 and second baffle 223 are respectively provided at the center of the source electrode 120 and at the center of the first shower head unit 210.

The bias electrode 130 is corresponded to the source electrode 120, provided in the vacuum chamber 110, and provided with the substrate 1 seated thereon. A bias impedance matching unit 161 is provided and connected to a bias RF power supply unit 160.

In particular, as shown in FIG. 4, the source electrode unit 120 is a circular plate-shaped electrode, and along an edge thereof, has a common contact point cc connected to a plurality of contact points by respective connection lines. The common contact point cc is connected to an impedance controller 150. Preferably, the plurality of contact points provided along the edge of the source electrode 120 is arranged to be rotationally symmetrical (with 360°/n, where n is the number of contact points) relative to the geometric center of the source electrode 120. The present exemplary embodiments show that eight contact points are arranged along the edge of the source electrode 120 with an included angle of 45°.

In this way, an edge impedance control device is provided in a rotationally symmetrical manner relative to the source electrode 120, so as to control edge impedance, whereby the uniformity of plasma between the center and the edge may be controlled. This is described in detail in accordance with the Korean patent of the applicant, which is described above in the background technology.

The plasma generator of the present disclosure configured in this way may increase the uniformity of etching and deposition by dividing a zone for gas into the center zone and the edge zone and controlling the amounts of reaction gas separately supplied to the respective zones. In addition, depending on conditions, gas concentrations of the center zone or the edge zone may be controlled before and after the process.

FIGS. 5A to 5D are graphs illustrating exemplary embodiments of controlling the flow rates of gas supplied to a center zone and an edge zone in the plasma generator according to the exemplary embodiment of the present disclosure.

Figure 5A:
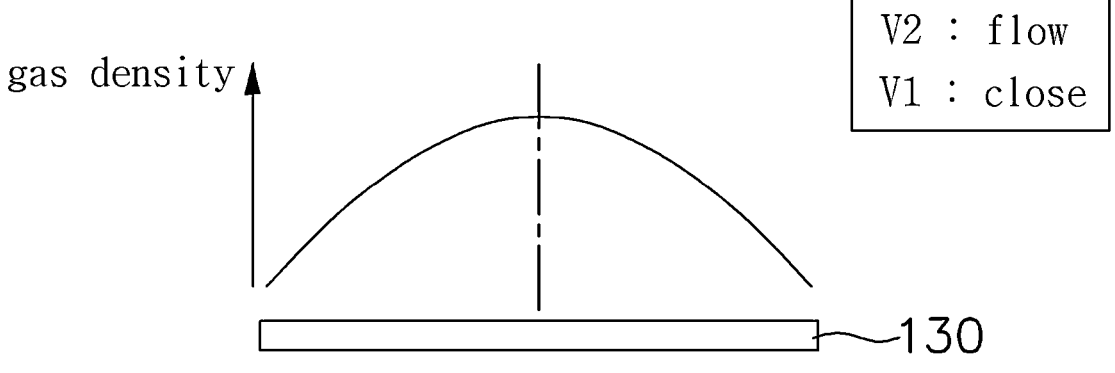
FIGS. 5A to 5D are graphs illustrating exemplary embodiments of controlling the flow rates of gas supplied to a center zone and an edge zone in the plasma generator according to the exemplary embodiment of the present disclosure.
Figure 5B:
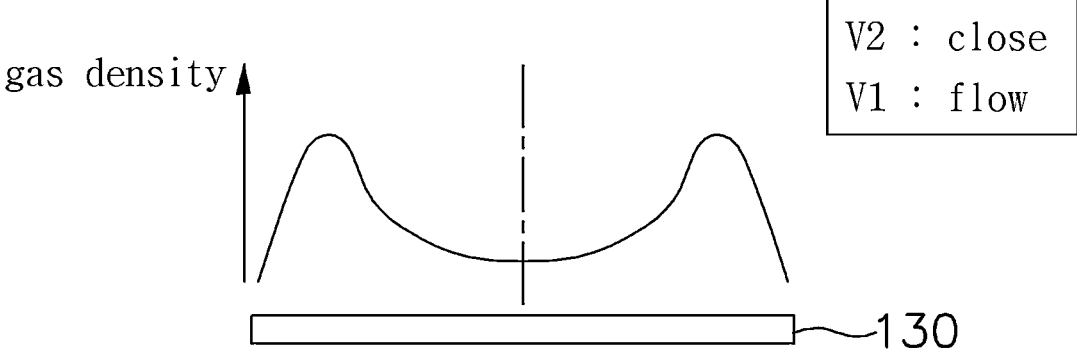

Referring to FIGS. 5A and 5B, the density of gas in the center zone or in the edge zone may be controlled by way of blocking a first supply control valve V1 configured to control a supply flow rate of a first gas supplied to the edge zone and opening a second supply control valve V2 configured to control a supply flow rate of a second gas supplied to the center zone, or by way of opening the first supply control valve V1 and blocking the second supply control valve V2.

Figure 5C:
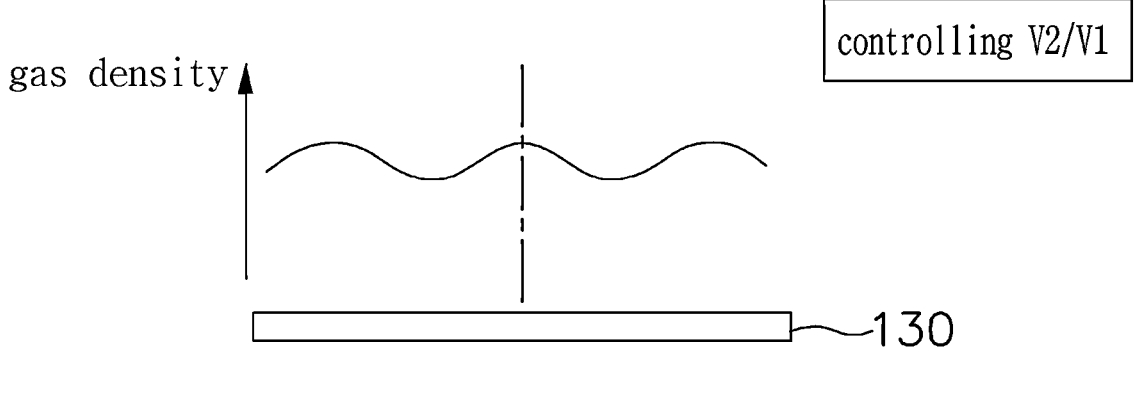
Figure 5D:
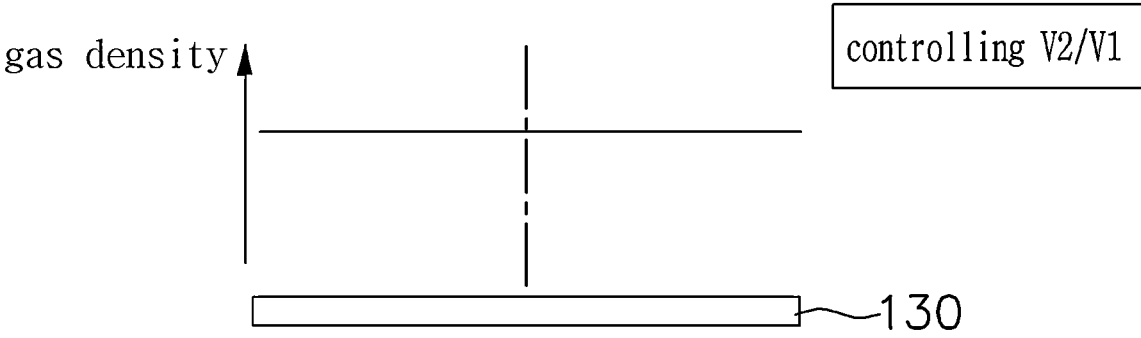

As shown in FIGS. 5C and 5D, the rate of etching or deposition may be evenly controlled by appropriately controlling the flow rate ratio (V2/V1) of the first supply control valve V1 and the second supply control valve V2.

In addition, the present disclosure is characterized by providing the plasma generator and the method of using the same for forming fine patterns and patterns having a high aspect ratio by precisely controlling ion energy. Hereinafter, specific exemplary embodiments thereof will be described.

Reactive-ion etching (RIE) performs etching of a substrate by accelerating ions in a plasma atmosphere, and the force applied to the ions is proportional to the bias applied to an electrostatic chuck (ESC). Self-bias VB applied to an electrode in RF-type plasma is expressed as [Equation 1] below.

$$V_B \propto \left(\frac{P_{RF}}{P}\right)^{1/2} \qquad \text{[Equation 1]}$$

In the above equation, $P_{RF}$ is RF power, and P is the pressure of a chamber.

In order to increase self-bias VB, it is required to increase RF power applied to an electrode. However, a method of increasing $P_{RF}$ to increase VB consumes significant energy and entails a high increase in cost. Alternatively, in a case of using high PRE, a lot of heat is generated in a chamber, so this may cause damage to a substrate, thereby becoming a factor that causes the yield of semiconductors to be reduced.

RF self-bias only acts as a negative bias, and serves to accelerate positive (+) ions to a substrate, but + ions are charged between substrate surfaces or fine patterns, thereby becoming a factor that causes a trajectory of the ions to bend. This may be very detrimental to the formation of fine patterns.

Figure 6:
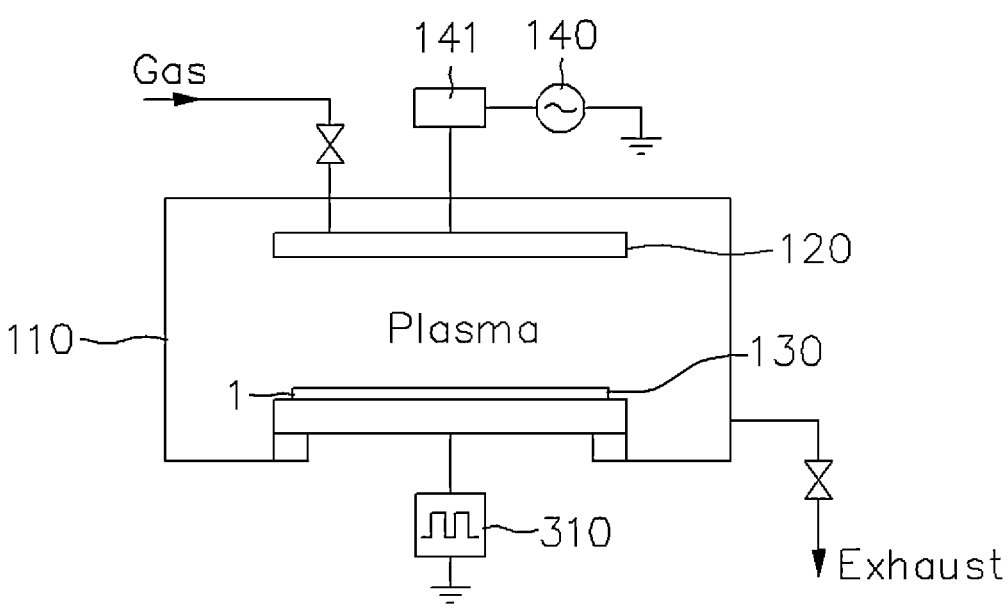
FIG. 6 is a configuration diagram illustrating a plasma generator according to another exemplary embodiment of the present disclosure.
Figure 7:
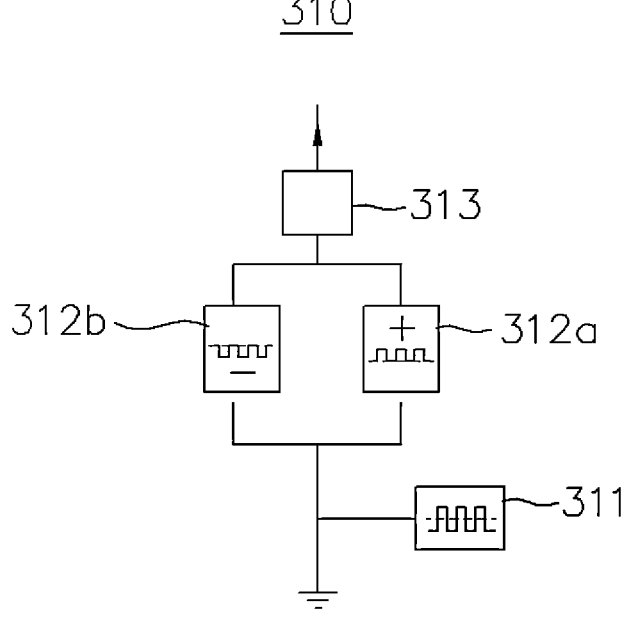
FIG. 7 is a configuration diagram illustrating a DC pulse generation module of the plasma generator according to another exemplary embodiment of the present disclosure.

FIG. 6 is a configuration diagram illustrating a plasma generator according to another exemplary embodiment of the present disclosure. FIG. 7 is a configuration diagram illustrating a DC pulse generation module of the plasma generator according to another exemplary embodiment of the present disclosure. Meanwhile, in the following description, the same configuration as the previous exemplary embodiments is used, and the shower head unit provided at the source electrode is omitted.

Referring to FIG. 6, as the same as the previous exemplary embodiments, a plasma generator 300 according to a present exemplary embodiment includes: a vacuum chamber 110; a source electrode 120 provided in the vacuum chamber; a bias electrode 130 corresponding to the source electrode 120, provided in the vacuum chamber 10, and provided with a substrate 1 seated thereon; an RF power supply unit 140 for supplying RF power to the source electrode 120; and a bias power supply unit connected to the bias electrode 130 to apply bias power. Preferably, the bias power supply unit is a DC pulse generation module 310 configured to generate a DC bias pulse. Such a DC pulse generation module 310 generates a DC bias in the form of a pulse, and the DC pulse may be a positive "+" pulse or a negative "−" pulse.

Referring to FIG. 7, a DC pulse generation module 310 includes: a pulse generator 311 for generating an alternating current (AC) pulse; a first rectifier 312a for generating a positive (+) DC pulse by performing half-wave rectification of the pulse generated by the pulse generator 311; and a second rectifier 312b for generating a negative (−) DC pulse by performing half-wave rectification of the pulse generated by the pulse generator 311. An RF filter 313 may be added to the output terminals of the first rectifier 312a and the second rectifier 312b.

Figure 8:
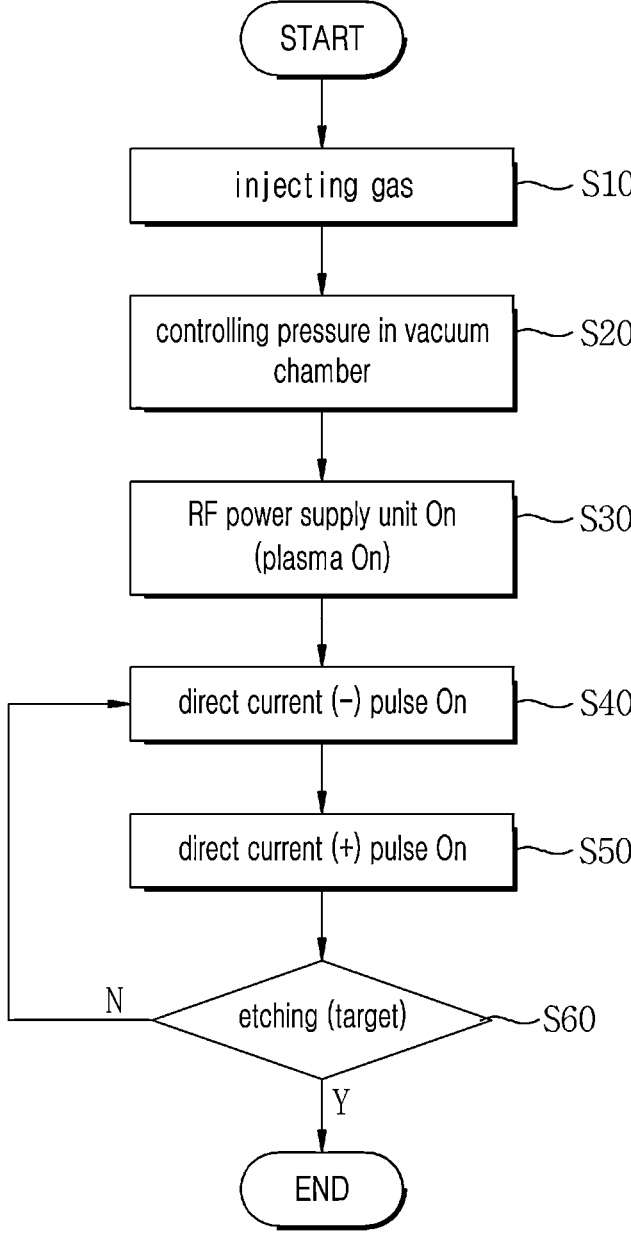
FIG. 8 is a flowchart illustrating an etching process of a substrate by the plasma generator according to another exemplary embodiment of the present disclosure.

FIG. 8 is a flowchart illustrating an etching process of a substrate by the plasma generator according to another exemplary embodiment of the present disclosure. FIGS. 9 and 10 are views briefly illustrating the progress of the etching process using the plasma generator according to another exemplary embodiment of the present disclosure.

Referring to FIG. 8, a method of etching a substrate includes: a first step S10 of injecting gas; a second step S20 of controlling pressure in a vacuum chamber; a third step S30 of applying RF power; a fourth step S40 of applying a negative (−) DC pulse to a bias power supply unit by using a DC pulse generation module; a fifth step S50 of applying a positive (+) DC pulse to the bias power supply unit by using the DC pulse generation module; and a sixth S60 of performing the etching of the substrate.

Figure 9A:
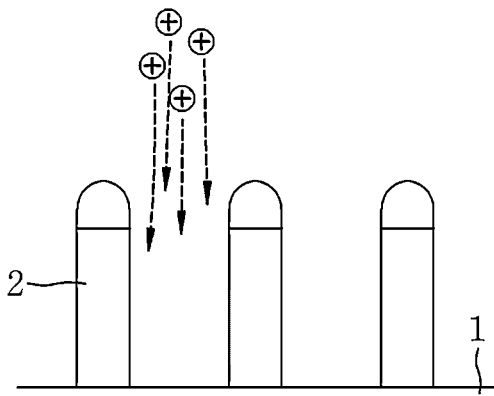
FIGS. 9A to 9C and 10A to 10C are views briefly illustrating the progress of the etching process using the plasma generator according to another exemplary embodiment of the present disclosure.
Figure 9B:
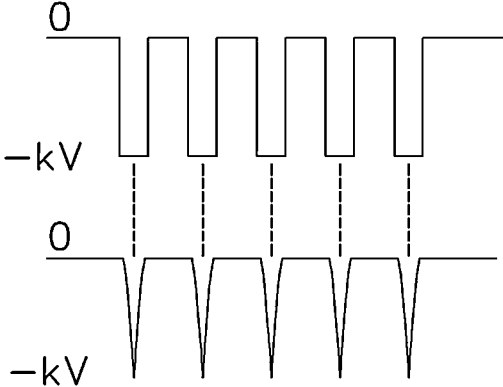
Figure 9C:
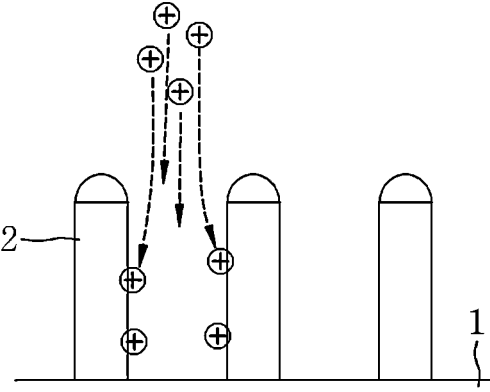

As shown in FIG. 9A, in the fourth step S40, a negative (−) DC pulse (in several ms) is applied to the bias power supply unit to accelerate target ions (+) to the substrate 1. Meanwhile, an upper part of FIG. 9B illustrates DC pulses generated from the DC pulse generation module, and a bottom part of FIG. 9B illustrates DC pulse signals applied to the bias power supply unit. The waveform of pulse applied to the bias power supply unit appears as a very short pulse waveform due to saturation by plasma. Meanwhile, as shown in FIG. 9C, when (+) ions accelerated into a pattern 2 of the substrate 1 accumulate on the pattern 2, a trajectory of each ion may be distorted and damage may occur in the pattern.

Figure 10A:
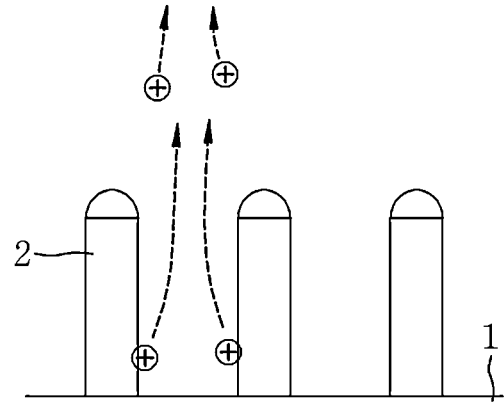
Figure 10B:
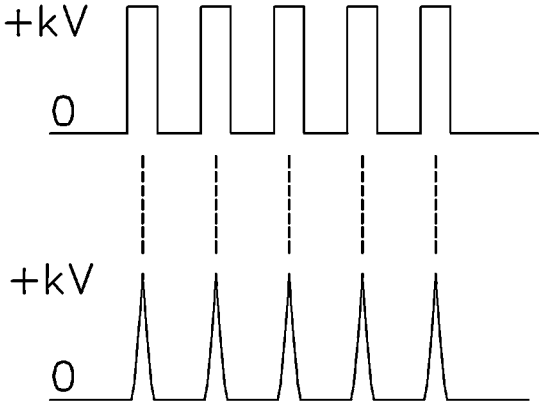
Figure 10C:
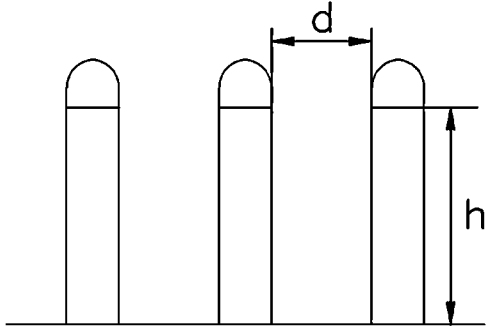

Next, in the fifth step S50, a positive (+) DC pulse is applied to the bias power supply unit to exhaust (+) ions from the surface of the substrate 1 (see FIG. 10A). The upper and lower parts of FIG. 10B respectively illustrate DC pulses generated from the DC pulse generation module and DC pulse signals applied to the bias power supply unit. Through such a process, patterns with a high aspect ratio (h/d) are able to be obtained (see FIG. 10C).

Figure 11:
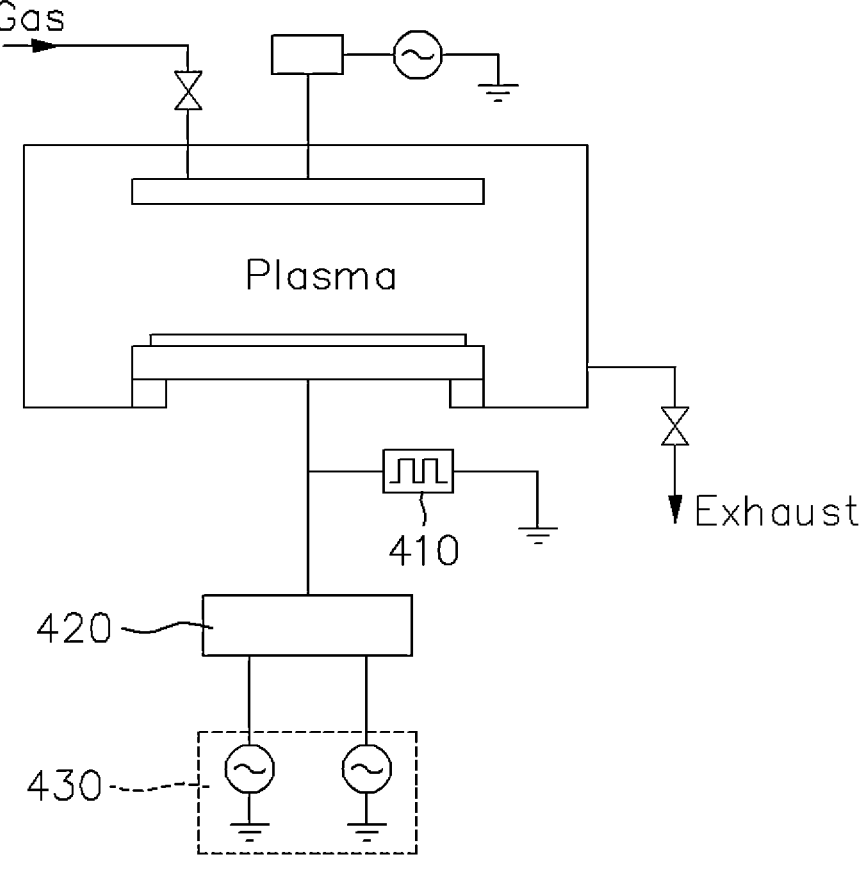
FIG. 11 is a configuration diagram illustrating a plasma generator according to a yet embodiment of the present disclosure.

FIG. 11 is a configuration diagram illustrating a plasma generator according to a yet another exemplary embodiment of the present disclosure, so overlapping descriptions of the same configuration as the previous exemplary embodiments will be omitted.

Referring to FIG. 11, a plasma generator 400 of a present exemplary embodiment is the same as the previous exemplary embodiments in that there is provided a DC pulse generation module 410 for generating a DC pulse and serving as a bias power supply unit that is connected to an electrostatic chuck and to which bias power is applied, and may additionally include: a bias matcher 420 for controlling an impedance connected in parallel with the DC pulse generation module 410; and an RF bias 430.

The present disclosure described above is not limited by the above-described exemplary embodiments and the accompanying drawings, and obviously, those skilled in the art will appreciate that various substitutions, modifications, and changes are possible within the scope of the technical spirit of the present disclosure.

What is claimed is:
1. A plasma generator comprising:
a vacuum chamber;
a source electrode provided in the vacuum chamber;
a bias electrode provided to correspond to the source electrode in the vacuum chamber and on which a substrate is seated;
a shower head unit provided on a lower part of the source electrode to supply reaction gas to a plasma space above the substrate;
an RF power supply unit for applying RF power to the source electrode; and
a bias power supply unit connected to the bias electrode to apply bias power, wherein the shower head unit is configured to control the reaction gas supplied to a center zone and an edge zone of the substrate, wherein the bias power supply unit comprises a direct current (DC) pulse generation module for generating a DC bias pulse, and the DC pulse generation module comprising:

a pulse generator for generating an alternating current (AC) pulse;

a first rectifier for performing half-wave rectification of the pulse generated by the pulse generator to generate a positive (+) DC pulse; and a second rectifier for performing half-wave rectification of the pulse generated by the pulse generator to generate a negative (−) DC pulse.

2. The plasma generator of claim 1, wherein the shower head unit comprises:

a first shower head unit having a first gas supply section provided with a first gas to be introduced to the edge zone of the substrate and a first gas inlet through which the first gas provided in the first gas supply section flows toward the edge zone of the substrate; and a second shower head unit having a second gas supply section provided with a second gas to be introduced to the center zone of the substrate and a second gas inlet through which the second gas provided in the second gas supply section flows to the center zone of the substrate.

3. The plasma generator of claim 2, wherein the second shower head unit further comprises:

a third gas supply section provided with a partition for dividing an internal space of the second shower head unit into a center zone and an edge zone, and having a third gas inlet through which the first gas provided in the third gas supply section flows to the edge zone of the substrate.

4. The plasma generator of claim 2, wherein the source electrode comprises:

a first gas supply port for injecting the first gas;

a second gas supply port for injecting the second gas; and a first baffle for diffusing the first gas injected through the first gas supply port to the first gas supply section.

5. The plasma generator of claim 4, wherein the first gas supply port is a contact point to which the RF power is applied.

6. The plasma generator of claim 5, wherein the first baffle is provided at a center of the source electrode.

7. The plasma generator of claim 4, wherein the first shower head unit further comprises:

a second baffle for diffusing the second gas supplied through the second gas supply port into the second gas supply section.

8. The plasma generator of claim 7, wherein the second baffle is provided at a center of the first shower head unit.

9. The plasma generator of claim 1, further comprising:

a bias matcher for controlling an impedance connected in parallel to the DC pulse generation module; and an RF bias.

10. A method of etching a substrate by using the plasma generator of claim 1, the method comprising:

a first step S10 of injecting gas;

a second step S20 of controlling pressure in a vacuum chamber;

a third step S30 of applying RF power by operating an RF power supply unit;

a fourth step S40 of applying a negative (−) DC pulse to a bias power supply unit by using a DC pulse generation module; and a fifth step S50 of applying a positive (+) DC pulse to the bias power supply unit by using the DC pulse generation module.

* * * * *